United States Patent [19]

Ohkase

[11] Patent Number: 5,443,648
[45] Date of Patent: Aug. 22, 1995

[54] VERTICAL HEAT TREATMENT APPARATUS WITH A ROTARY HOLDER TURNING INDEPENDENTLY OF A LINER PLATE

[75] Inventor: Wataru Ohkase, Sagamihara, Japan

[73] Assignees: Tokyo Electron Kabushiki Kaisha, Tokyo; Tokyo Electron Toboku Kabushiki Kaisha, Iwate, both of Japan

[21] Appl. No.: 225,618

[22] Filed: Apr. 11, 1994

[30] Foreign Application Priority Data

Apr. 13, 1993 [JP] Japan .................................. 5-086340

[51] Int. Cl.⁶ .......................................... C23C 16/00
[52] U.S. Cl. ...................................... 118/724; 118/715; 118/725; 118/728; 118/729; 118/730
[58] Field of Search ............... 118/724, 725, 728, 729, 118/730, 715; 219/390, 405, 411, 406, 407, 408, 409, 410; 392/416, 418

[56] References Cited

U.S. PATENT DOCUMENTS

| | | | |
|---|---|---|---|
| 4,745,088 | 5/1988 | Inoue | 437/102 |
| 4,857,689 | 8/1989 | Lee . | |
| 5,029,554 | 7/1991 | Miyashita | 118/715 |
| 5,148,714 | 9/1992 | McDiarmid . | |
| 5,238,499 | 8/1993 | Van De Ven | 118/724 |
| 5,329,095 | 7/1994 | Okase | 219/390 |

FOREIGN PATENT DOCUMENTS 63-232422  9/1988  Japan .
2-216820   8/1990  Japan .

*Primary Examiner*—R. Bruce Breneman
*Assistant Examiner*—Jeffrie R. Lund
*Attorney, Agent, or Firm*—Beveridge, DeGrandi, Weilacher & Young

[57] ABSTRACT

A vertical heat treatment apparatus which has a vertical processing vessel with heat source, and a loading mechanism for holding an object to be treated and for loading and unloading the object into and out of the processing vessel through its bottom. The loading mechanism includes an outer cylindrical shaft which is moved up and down by a lift drive unit, a liner plate disposed on the upper end of the outer rotary shaft, and a rotary holder which is disposed in the liner plate and is moved up and down independently of the liner plate. As a result, a large object to be treated, such as a large-diameter semiconductor wafer, LCD substrate, etc., can be rapidly heated up to a required treatment temperature while uniform temperature distributions are attained. Thus, heat-treatments of high precision can be efficiently conducted.

8 Claims, 3 Drawing Sheets

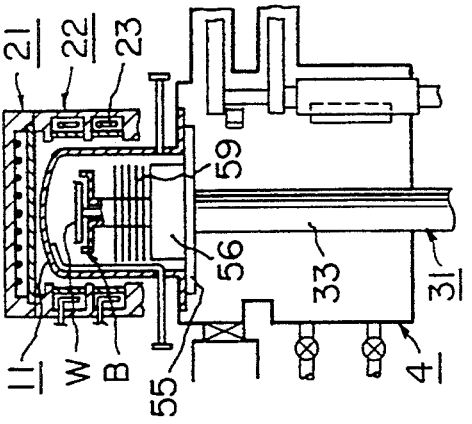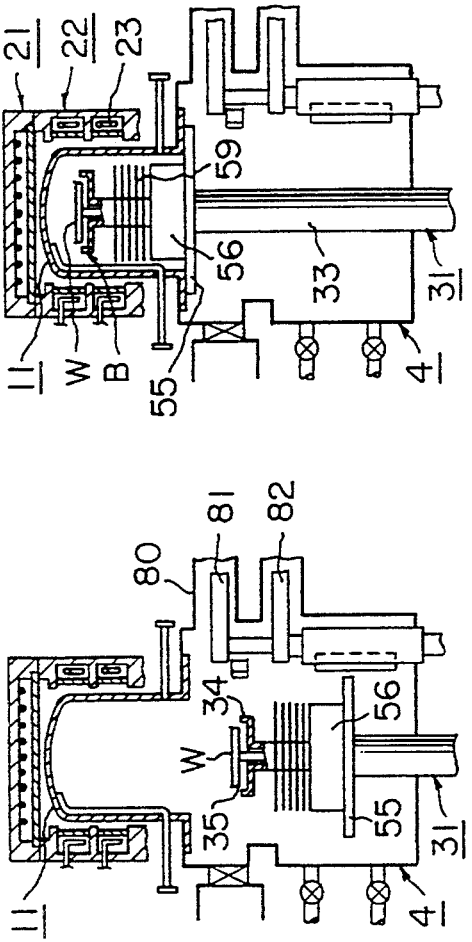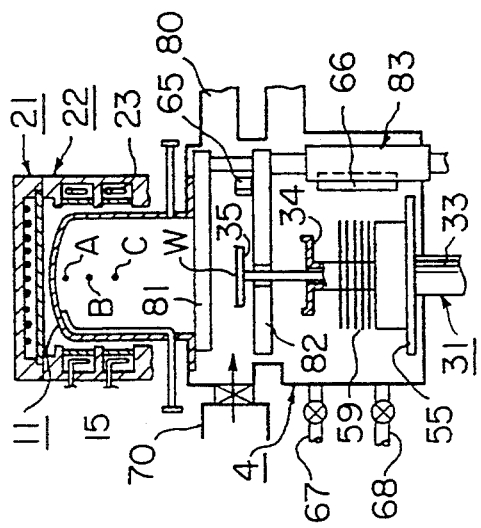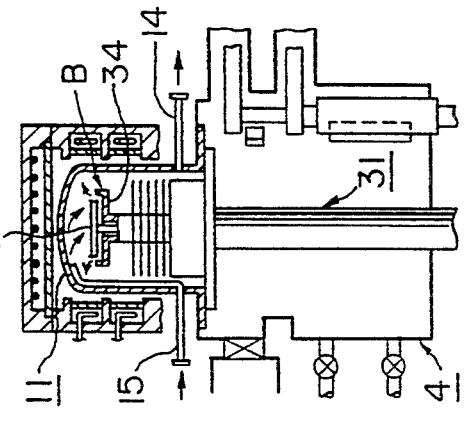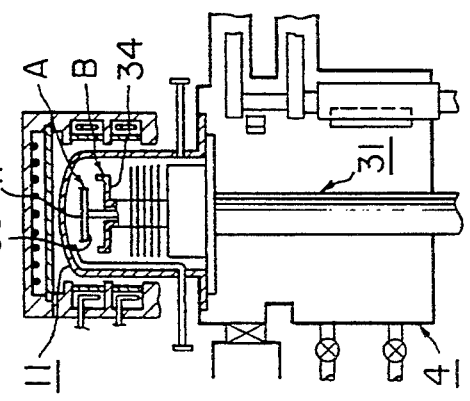

VERTICAL HEAT TREATMENT APPARATUS WITH A ROTARY HOLDER TURNING INDEPENDENTLY OF A LINER PLATE

BACKGROUND OF THE INVENTION

The present invention relates to a vertical heat treatment apparatus to be used in fabrication processes of objects to be fabricated, e.g., semiconductor devices, LCD substrates, etc.

A variety of conventional heat treatment apparatuses have been used in semiconductor fabrication processes. These fabrication processes include treatments, such as forming oxide films, forming thin films by thermal CVD, forming heavily doped regions, etc., on semiconductor wafers, LCD substrates, etc. The heat treatment apparatuses for these purposes have been conventionally of the horizontal type, but recently those of the vertical type are becoming dominant. In such a vertical heat treatment apparatus, a heat source, such as a heater, is provided on the upper surface or around a vertical processing vessel of, e.g., quartz, having an inverted U-shaped section. A loading mechanism, such as a wafer boat or others, is provided for loading objects to be treated, while held in a horizontal orientation, into the processing vessel from below the processing vessel, so that the objects to be treated are heated up to a required temperature in the processing vessel. Various heat treatments are then conducted on the objects to be treated with required gases fed into the processing vessel.

Higher precision of such heat treatments, higher treating efficiency, etc. are required of such vertical heat treatment apparatus to achieve homogeneous film quality and uniform film thicknesses in a plane of the objects to be treated. In addition, semiconductor processing is increasingly becoming more precision oriented, and the typical diameter of semiconductor wafers that are being treated has increased from 8 inches to 12 inches. The heat treating requirements associated with larger size substrates, such as LCD substrates, etc. are more exacting than those for smaller sized substrates. These requirements involve, for example, higher precision and higher efficiency in the heat treatments being made.

To meet these requirements, an important factor is how to heat and treat efficiently for a short period of time the objects to be treated that are loaded in the process vessels of the vertical heat treatment apparatus. An additional important factor is how to improve, in the heat treatment, the uniformity of temperature distributions in the place where the loaded objects are treated.

But in the conventional vertical heat treatment apparatus, objects to be treated are heated only by a heat source, e.g., a heater or the like, which is provided on the upper surface of the processing vessel or around the same and whose output is controlled to heat the objects to be treated by radiant heat. No additional means for achieving more homogeneous heating is provided. Accordingly, the above-described requirements cannot be met when treating large objects, such as large diameter semiconductor wafers, LCD substrates, etc. whose uniform temperature distribution in place cannot be achieved because the abrupt heating requirement presents difficulties in connection with maintaining the desired treating temperatures. For instance, disuniform temperatures partially occur in the circumferential direction of the objects to be treated, and temperature differences take place between the central parts of the objects to be treated and the peripheral parts thereof due to larger heat radiation amounts in the peripheral parts as compared with the central parts.

SUMMARY OF THE INVENTION

The present invention has been made in view of the above-described problems. An object of the present invention is to provide a vertical heat treatment apparatus which can rapidly heat even large objects to be treated, such as large diameter semiconductor wafers, LCD substrates, etc. to the required treating temperatures, can achieve uniform temperature distributions in plane, and can efficiently conduct heat treatments of high precision.

To achieve the above-described object, the present invention provides a vertical heat treatment apparatus comprising a vertical processing vessel additionally including a heat source, and a loading mechanism for holding an object to be treated and loading the same into the processing vessel from below, whereby the object to be treated is heated to a required treating temperature in the processing vessel to be heat treated as required. The loading mechanism includes a lift member to be loaded into and unloaded out of the processing vessel through the bottom thereof by a lift drive unit, a liner plate provided on the upper end of the lift member, and a rotary holder for holding the object to be treated horizontal above the liner plate while turning the object to be treated independently of the liner plate.

The rotary holder is independently moved up and down with an object to be treated mounted on it so that the object to be treated can be quickly moved between a heating position and a treating position.

The loading mechanism includes gas injection means for injecting from below a film formation preventive gas to the underside of the object to be treated held on the rotary holder. The film formation preventive gas is injected to prevent the formation of films on the underside of the object to be treated, so that films are formed on only the surface of the object to be treated.

According to the vertical heat treatment apparatus of the above-described constitution, an object to be treated, such as a semiconductor wafer, an LCD substrate or other, is held in a horizontal orientation on the rotary holder which is on the upper end of the lift member of the loading mechanism and above the liner plate. The object is loaded into the processing vessel where the object to be treated is heat treated by heat supplied from the heat source annexed or positioned adjacent to the processing vessel. As a result, the heat-adsorption effect of the liner plate, and the rotation of the rotary holder, decrease circumferentially local disuniform temperatures and temperature differences between the central parts and the peripheral parts of even large objects to be treated, such as large-diameter wafers, LCD substrates, etc., so that the large objects can be quickly and efficiently heated to set treatment temperatures while attaining uniform temperature distributions in plane, and accordingly treatments of high precision can be efficiently conducted.

The rotary holder with an object to be treated held in a horizontal orientation thereon is moved independently up and down in the processing vessel, whereby the object to be treated is moved to a high-temperature treatment position in the processing vessel to be rapidly heated up to a required treatment temperature, and then is quickly moved to a suitable temperature processing position in the processing vessel for a treatment. As a result, further improved efficiency, and uniform temperature distributions in plane can be realized.

Then an object to be treated is heat treated, a film formation preventive gas is injected by gas injection means of the loading mechanism and is injected from below to the underside of the object to be treated held on the rotary holder, whereby processing gases introduced into the processing vessel are hindered from flowing into the underside of the object to be treated, so that films can be formed on only the desired surface while preventing the formation of films on the underside of the object to be treated, i.e., without forming unnecessary films.

BRIEF DESCRIPTION OF THE DRAWINGS

FIGS. 4A to 4E are explanatory views of a sequence of the operation of the vertical heat treatment apparatus of FIG. 1.

DETAILED DESCRIPTION OF PREFERRED EMBODIMENTS

Figure 1:
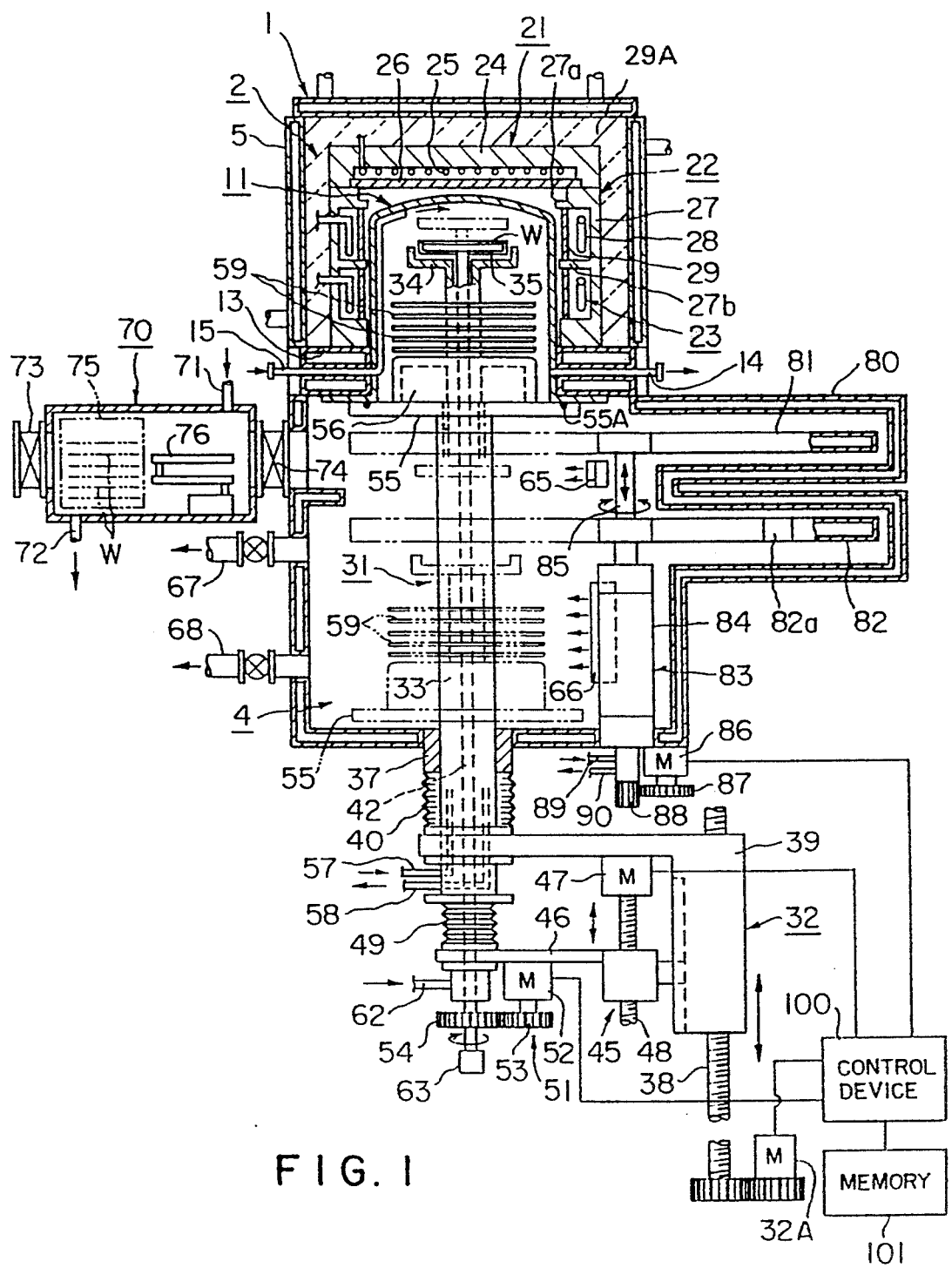
FIG. 1 is a schematic vertical sectional view of the vertical heat treatment apparatus according to one embodiment of the present invention.

The vertical heat treatment apparatus according to one embodiment of the present invention will be explained with reference to the drawings. FIG. 1 is a substantially general vertical sectional view of the vertical heat treatment apparatus according to this embodiment. This vertical heat treatment apparatus is used as an oxidation apparatus or a CVD apparatus for forming insulating films on an object to be treated, e.g., semiconductor wafers (hereinafter called wafers).

In FIG. 1 reference numeral 1 represents a body of the apparatus of a closed box structure which ensures airtightness. An upper half of the interior of the body 1 is a heat treatment chamber 2, and a lower half thereof is a loading chamber 4 where semiconductor wafers W as objects to be treated are loaded into and unloaded from the heat treatment chamber.

The heat treatment chamber 2 and the loading chamber 4 of the body 1 have their peripheral walls formed of a double wall structure of, e.g., stainless steel. Water can be passed between the inner and the outer walls, and a water jacket 5 is provided. Accordingly the interior of the body 1 is thermally isolated from the outside while high-temperature heat treatment can be conducted inside the heat treatment chamber without giving thermal influence to the outside. In addition, the efficiency of cooling the heat treated wafers W in the loading chamber 4 can be increased.

In the heat treatment chamber 2 there is erected a processing vessel (process tube) 11. The processing vessel 11 is one kind of heating furnace and is formed of, e.g., quartz, which has good heat resistance and is less contaminative. The processing vessel 11 is in the shape of a hat, i.e., a vertical substantial cylinder having a furnace port opened in the lower end with the upper end closed.

A manifold 13 of substantially the same water cooling structure as described above is secured to a lower part of the outer periphery of the processing vessel 11 in the heat treatment chamber 2. The manifold 13 partitions the heat treatment chamber 2 from the loading chamber 4. Through the manifold 13 there are provided a discharge pipe 14 for evacuating to the outside (reducing a pressure) gases in the processing vessel 11, and a gas feed pipe 15 for supplying required treatment gases from an outside gas supply source and an inert gas, such as $N_2$ gas or others, from above into the processing vessel 11.

A first heater unit 21, a second heater unit 22, and a third heater units 23 as heat sources are provided around the processing vessel 11 in the heat treatment chamber 2.

The first heater unit 21 is arranged in plane above the processing vessel 11, and comprises a heater element 25 of lines of molybdenum dicilicide, KANTHAL (tradename) line of an iron, chrome and aluminum alloy or others arranged in plane as a plate heater on the underside of a substantially flat heat insulating plate 24 of, e.g. alumina ceramics or others, and a flat liner plate 26 provided inside the heater element 25. The liner plate 26 functions to remove disuniform heating of the plate heater, i.e., disuniform distributions of radiation heat which has entered the processing vessel 11 from the heater element 25, and is formed of a material which is highly heat resistant to high temperature radiation heat and is less contaminative, e.g., silicon carbide, or quartz or graphite having the surface coated with silicon carbide.

The second and the third heater units 22, 23 are annular auxiliary heaters arranged respectively around an upper part and a middle part of the outside periphery of the processing vessel 11. Almost similarly with the first heater unit 21, the second and the third heater unit 22, 23 each comprise a heat insulating plate, a U-shaped heater element 28 arranged inside of the heat insulating plate 27 as a heater, and a heat liner plate 29 arranged on the inside of the heater element 28. In the second and the third heater units 22, 23, the heat insulating plate 27 and the liner plate 29 are cylindrical and the heater element 28 between the heat insulating plate and the heat liner plate 29 is provided by circumferentially arranged resistant heaters.

On the heat insulating plates 27 of the second and the third heater units 22, 23 there are provided rib-shaped partition convexities 27a, 27b for shielding heat interference of the second and the third heater units 22, 23 with each other.

Owing to this structure, the processing vessel 11 can have inside, as shown in FIG. 4A, a first zone A which is uppermost for receiving incident heat energy mainly of the plate heater of the first heater unit 21, a second zone B which is the second zone for receiving incident heat energy mainly of the second heater unit 22, and a third zone C which is a middle zone of the processing vessel 11 for receiving incident heat energy mainly of the third heater unit 23. Heating temperatures of the first to the third zones A, B, C can be optionally set by power control of the first to the third heater units 21, 22, 23.

As shown in FIG. 1, a space between the outside circumferential surfaces of the first to the third heater units 21, 22, 23 and the inside surface of the body 1 of the apparatus is filled with a heat insulating material 29A, such as quartz wool or others for enhancing heat insulation from the outside.

As shown in FIG. 1, in the loading chamber 4, which occupies a lower half of the apparatus body 1, a loading mechanism (wafer boat elevator) 31 which holds objects to be treated, wafers W, and loads/unloads the same one by one into/from the processing vessel] 1 through the bottom thereof. The loading mechanism 31 comprises a lift drive unit 32, an outer cylindrical shaft 33 as a lift member which is driven by the lift drive unit 32 to be inserted into and out of the processing vessel 11 through the bottom thereof, a liner plate 34 provided on the upper end of the cylinder shaft 33, and a rotary holder 35 provided above the liner plate 34 for holding a wafer W.

The outer cylindrical shaft 33 is relatively thick and long, and hollow. The shaft 33 is disposed upright along the central axial line of the furnace port in the bottom of the processing vessel 11 and is vertically movable through a bearing 37 inserted in the bottom of the loading chamber 4. The outer cylindrical shaft 33 is driven up and down by the lift drive unit 32.

The lift drive unit 32 comprises a screw shaft 38 which is rotated clockwise and counter-clockwise by a motor 32A disposed below the loading chamber 4, and a lift support arm 39 which is in screw-engagement with the screw shaft 38 and is vertically moved by the screw. The outer cylindrical shaft 33 is supported by the lift support arm 39 to be moved up and down. A stretchable bellows 40 is provided between the bearing 37 and the lift support arm 39 for retaining air-tightness of the interior of the loading chamber 4 with respect to an outside atmosphere when the outer cylindrical shaft 37 is moved Up and down.

Figure 2:
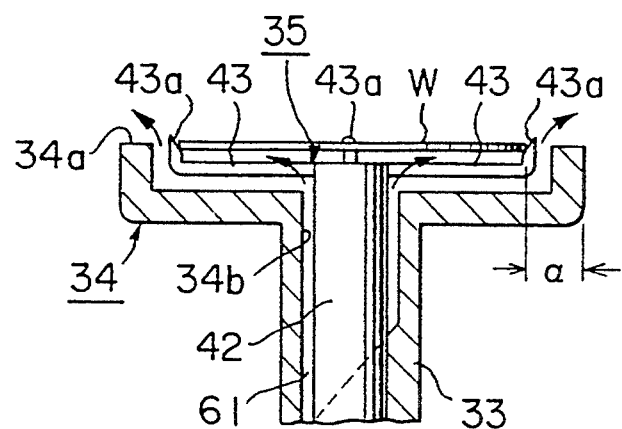
FIG. 2 is a vertical sectional view of the rotary holder provided on the upper end of the loading mechanism of the vertical heat treatment apparatus of FIG. 1 and the liner plate provided on the loading mechanism.
Figure 3:
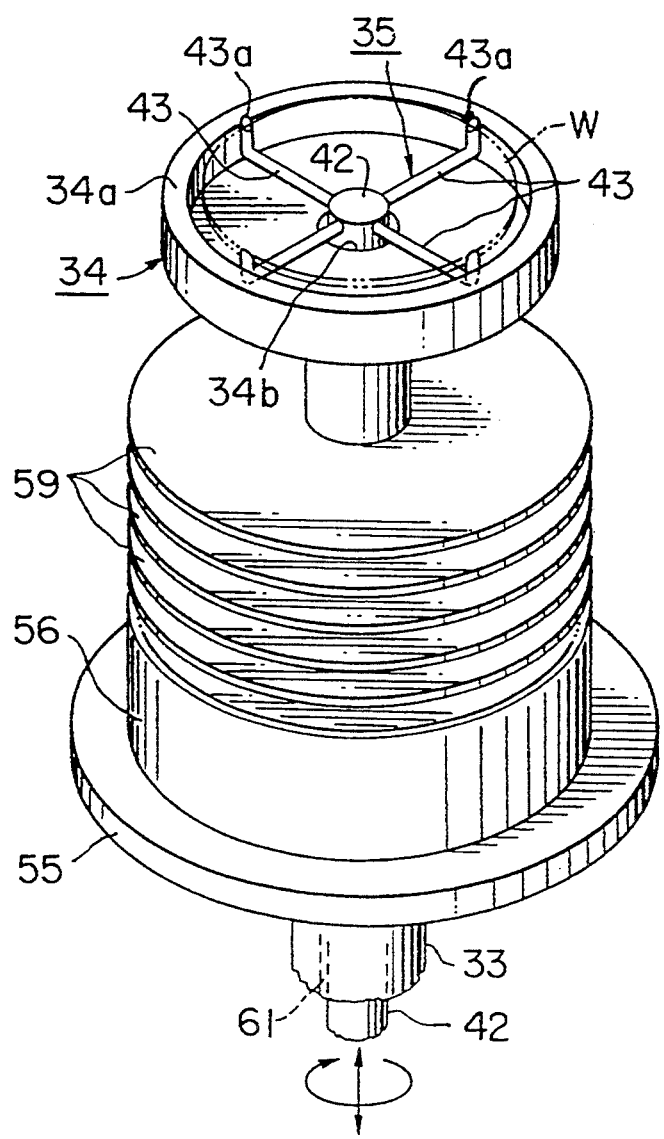
FIG. 3 is a perspective view of the liner plate and the rotary holder of FIG. 2, and a lid.

The liner plate 34 is also formed of a material, e.g., high purity silicon carbide (SiC) or quartz, which is highly heat resistant to high temperature radiation heat and is less contaminative. As shown in FIGS. 2 and 3, the liner plate is in the shape of a circular shallow dish having a raised peripheral edge 34a, is disposed horizontally on the upper end of the outer cylindrical shaft 33, and has an opening 34b in the center thereof, which is in communication with the interior of the outer cylindrical shaft 33. The liner plate 34 has a diameter larger than an outside dimension of the wafer W by α (about 30 mm) for the prevention of cooling of a wafer W when the wafer W is lifted up and down.

The rotary holder 35 has a central rotary shaft 42. As shown in FIGS. 2 and 3, a plurality (e.g., 4) of slender support rods 43 which are projected radially from the upper end of the rotary central shaft 42 and disposed circumferentially at a certain interval. A small length of the forward end of each support rod 43 is bent upward in an L shape, and the forward end is cut off, declined inward in a slant surface 43a.

The respective slant surfaces 43a receive the lower outer peripheral portion (edge) of the wafer W at four positions to hold the wafer W horizontal above the liner plate 34. The rotary holder 35 is also formed of a material which is highly heat resistant to high temperature radiation heat and is less contaminative, e.g., high purity silicon carbide (SiC) or quartz.

As shown in FIG. 1, the rotary central shaft 42 of the rotary holder 35 has a small diameter and is long, and is put rotatably and vertically movably through a central opening of the liner plate 34 and the outer cylindrical shaft 33. The rotary central shaft 42 is jutted more downward beyond the outer cylindrical shaft 33 and is supported by a lift support arm 46 of a sub-lift drive unit 45 mounted on the lift support arm of the lift drive unit 32.

Thus the rotary holder 35 is moved up and down together with the outer cylindrical shaft 33 through the rotary central shaft 42, and is moved up and down alone quickly by screwing of the screw shaft 48 rotated clockwise and counter-clockwise by the motor 47 of the sub-lift drive unit 45. A stretchable bellows 49 is provided between the lower end of the outer cylindrical shaft 33 and the lift support arm 46 for retaining air-tightness of the interior of the lower end portion of the outer cylindrical shaft 33 with respect to an outside atmosphere when the rotary central haft 42 is moved up and down.

The rotary central shaft 42 of the rotary holder 35 is rotated by gears 53, 54 by the drive of the motor 52 of a rotation drive motor 51 mounted on the lift support arm 46 of the sub-lift drive unit.

That is, the loading mechanism 31 with a wafer W held in a horizontal orientation on the rotary holder 35 above the liner plate 34 is lifted together with the outer cylindrical shaft 33 to be loaded into the processing vessel 11. Further the rotary holder 35 independently moves up and down in the processing vessel 11 so as to quickly displace the wafer W from a high-temperature heating position (e.g., the A zone) to a suitable temperature treating position (e.g., the B zone) as shown in FIG. 4.

As shown in FIG. 1, the loading mechanism 31 has a lid 55 provided on the outer cylindrical shaft 33 at a position nearer to the upper end thereof for gas sealing and heat shielding for the interior of the processing vessel 11 during a heat treatment of a wafer W. When the outer cylindrical shaft 33 is raised, the lid 55 is brought into contact with the furnace port in the bottom of the processing vessel 11 through a seal member 55A to place the interior of the processing vessel 11 in a completely sealed condition with respect to the loading chamber 4. On the upper surface of the lid 55 there is provided a hollow annular water cooling disk 56. Water can be circulated through the water cooling disk 56 through the outer cylindrical shaft 33 by water feed hoses 57, 58 provided in the lower end portion of the outer cylindrical portion. A plurality of thin reflectors 59 of quartz in the form of heat radiation fins are secured to an upper part of the water cooling disk 56 in multi-steps by soldering or others.

The loading mechanism 31 has gas injection means for injecting a trace of a film formation preventive gas for the prevention of formation of a film on the underside of a wafer W when the wafer W is heat treated in the processing vessel 11. As shown in FIGS. 2 and 3, the gas injection means is a gas conduit 61 between the outer cylindrical shaft 33 and the rotary central shaft 42 over a length thereof, whose upper end is in communication with the central opening 34b of the liner plate 34 and whose lower end is in communication with the interior of the bellows 49 shown in FIG. 1. A gas hose 62 is connected to the bellows 49 for introducing the film formation preventing gas into the bellows 49 from the outside.

In the loading mechanism 31 the rotary central shaft 42 is also hollow, and a temperature sensor 63 is inserted in the rotary central shaft 42 from below so that temperatures of a wafer W mounted on the rotary holder 35 are detected for various controls.

When a wafer W is loaded into/unloaded out of the processing vessel 11 by the loading mechanism 31, a high-temperature atmosphere is present even near the furnace port, and in the presence of such atmosphere there is a risk that natural oxide films may be formed on the wafer W. Then it is preferred that the interior of the loading chamber 4 has a closed structure (isolated from the atmospheric air) under an atmosphere of an inert gas (nonoxygen atmosphere), such as $N_2$ gas or others.

To this end, on an upper part and a lower part of one inside of the loading chamber 4, gas feed nozzles 65, 66 for feeding $N_2$ gas are provided as the gas feed means, and gas exhaust pipes 67, 68 are provided on the opposite inside.

A load lock chamber 70 is provided for continuously conveying wafers W as objects to be processed into the loading chamber 4, isolated from the atmospheric air. The load lock chamber 70 has a relatively small box shape so as to facilitate displacement of atmospheric air with an inert gas, and is connected at the top to a gas feed pipe 71 for $N_2$ gas or others and at the bottom to an exhaust pipe 72. Gate valves 73, 74 are provided on the left and the right sides of the load lock chamber 70. Inside the load lock chamber 4 there are provided a buffer 75 for temporarily mounting wafers W and a transfer mechanism (a handling robot) 76.

That is, the gate valve 73 is opened and wafers W are put onto the buffer 75 in the load lock chamber 70 from the outside by a conveying robot or others. With the gate valve 73 closed, the interior of the load lock chamber 70 is placed under an atmosphere of an inert gas. Then the other gate valve 74 is opened to transfer the wafers W one by one by the transfer mechanism 76 onto the rotary holder 35 of the loading mechanism 31 in the loading chamber 4. The treated wafers W are taken outside by the reverse procedure. Accordingly the loading operation of wafers W from the loading chamber 4 into the processing vessel 11, and the unloading operation reverse to the load operation can be conducted throughout in an atmosphere of an inert gas, such as $N_2$ gas isolated from the outside atmospheric air.

A total of two load lock chambers 70 are preferably provided on the loading chamber 4 at opposing front and back positions (only one shown in FIG. 1), so that wafers W can be conveyed in a one-way manner.

An inverted E-shaped box 80 covered with a water jacket is provided on a side of the loading chamber 4, continuously opened in the loading chamber 4. The box 80 accommodates a furnace port shutter 81 of a sectional shape which is made of a material of high heat resistance and heat insulation and can close the furnace port, and a partition shutter 82 which can partition the interior of the loading chamber 4 vertically in an upper part and a lower part. The furnace port shutter 81 and the partition shutter 82 are disposed parallel with each other at a vertical interval from each other and each have one end thereof supportably connected to a rod 85 of an air cylinder 84 of a swing/lift drive mechanism 83. The swing/lift mechanism 83 has an air cylinder 84 for lift, and a motor 86 and spline gears 87, 88 for the swing which rotate the rod 85.

When the loading mechanism 31 is moved up and down, the furnace port shutter 81 and the partition shutter 82 are withdrawn in the box 80 not to hinder the loading mechanism 31. When the loading mechanism 31 has been lowered, the rod 84 is rotated by the motor 86 of the swing/lift drive mechanism 83 to swing the furnace port shutter 81 and the partition shutter 82 to the center of the loading chamber 4. Further both shutters 81, 82 are pushed up so that the upper furnace port shutter 81 is brought into abutment on the furnace port in the bottom of the processing vessel 11 through the seal member 55A, whereby the interior of the processing vessel 11 is gas sealed while preventing escape of heat into the loading chamber 4. Concurrently the lower partition shutter 82 partitions the interior of the loading chamber 4 up and down.

The partition shutter 82 has an arcuate groove 82a formed in the middle thereof. When the partition shutter 82 is swung into the loading chamber 4, the arcuate groove 82a receives the rotary central shaft 42 of the loading mechanism 31 which has been lowered and partitions the interior of the loading chamber 4 up and down between the liner plate 34 and the rotary holder 35.

Thus treated wafers W at a high temperature unloaded out of the processing vessel 11 into the loading chamber 4 are separated from the liner plate 34 and the reflectors 59 similarly at the high temperature to be efficiently respectively cooled. Their cooling is conducted by introduction of an inert gas from the gas injection nozzles 65, 66 and suction exhaust of the gas through the exhaust pipes 67, 68.

The furnace port shutter 81 and the partition shutter 82 are formed in hollow discs. Water is circulated through the hollow discs through the rod 85 from water hoses 89, 90 provided in the lower part of the rod 85, and a water cooling structure is provided.

The motors 47, 52, 86, and the motor 32A of the lift drive unit 32 are controlled by control means 100, based on data stored in a memory unit 101.

The operation of the vertical heat treatment apparatus according to the present invention having the above-described structure will be explained. The interiors of the processing vessel 11 and the loading chamber 4 in FIG. 1 are beforehand replaced by an atmosphere of an inert gas, such as $N_2$ gas. In this state wafers W are conveyed from the outside into the load lock chamber 70 through the gate valve 73. After atmospheric air in the interior of the load lock chamber 70 is replaced by an inert gas, only the gate valve 74 inside the load lock chamber 70 is opened, and the transfer mechanism 76 takes out one of the wafers W and transfers the same onto the rotary holder 35 of the loading mechanism 31 in the loading chamber 4 as shown in FIG. 4A.

In this state, the furnace port shutter 81 and the partition shutter 82 are retreated in the box 80 as in FIG. 4A, and loading mechanism 31 is lifted as in FIG. 4C and loads the wafers into processing chamber 11 while the furnace port in the bottom of the processing vessel 11 is closed by the lid 55.

At this time, the first heater 21 on the top of the processing tube 11 is controlled to retain a constant high heating temperature of about 1200° C. and sets the first zone A, which is the uppermost, at a highest-temperature heating position. The second heater unit 22, which is around an upper outside periphery of the processing vessel 11, is controlled to at first have a high temperature and then to lower the temperature to about 800° C. when a wafer comes up, so that the second zone B, which is next uppermost, has a suitable treating temperature. The third heater unit 23, which is around the middle outside periphery of the processing vessel 11, is controlled to at first have a high temperature and lower the temperature to about 800° C. when a wafer comes up, so that the third middle zone C is set at a suitable heat retaining temperature.

The rotary holder 35 on the upper end of the outer cylindrical shaft 33 and above the liner plate 34 with a wafer W mounted on horizontal is lifted to the second zone B in the thus heated processing vessel 11. Even when the wafer has a large diameter, owing to the liner effect of the liner plate 34 and the rotation of the rotary holder 35, the wafer W can be efficiently heated with a substantially uniform temperature distribution in plane substantially without circumferentially local disuniform temperatures, and temperature differences between the central part and the peripheral part.

As shown in FIG. 4D, the rotary holder 35 is lifted independently from the liner plate 34, turning the wafer W, to the first uppermost zone for the above-described high-temperature heating. There the wafer W is rapidly heated and is lowered to the zone B set as a suitable temperature treatment position when the wafer W reaches a set treating temperature. By rapid temperature changes provided by such up-and-down displacement, while temperatures of the wafer W in plane can be more uniform, the wafer W can be heated at once very efficiently up to a set treating temperature.

The wafer which has been thus heated to a set treating temperature is stopped in the second zone set as a suitable treating temperature zone, and as shown in FIG. 4E, $N_2$ gas in the processing vessel 11 is exhausted while required treating gases are fed from above, and the surface of the wafer W is subjected to a required heat treatment (film formation).

At this time, as shown in FIG. 1, a film formation preventive gas is fed into the gas passage 61 from the gas hose 62 in the lower part of the loading mechanism 31. The gas is injected bit by bit from the central opening 34b in the liner plate 34 as shown in FIG. 2 onto the underside of the wafer W. The film formation preventive gas flows through a gap between the liner plate 34 and the wafer W to thereby prohibit the treatment gases from flowing into the underside of the wafer W, whereby the formation of films on the underside of the wafer W is prevented, i.e., films can be formed only on the surface of the wafer W without forming films on the unnecessary surface.

After this heat treatment, the treatment gases in the processing vessel 11 are evacuated, and an inert gas, such as $N_2$ gas is fed into the interior of the processing vessel 11 to purge the same. In this state, the treated wafer W is conveyed out in the procedure substantially reverse to that for conveying in the wafer W.

When the wafer W is conveyed out, the loading mechanism 31 is lowered to draw the wafer W out of the processing vessel 11 into the loading chamber 4. At this time, with the rotary holder 35 holding the wafer W retained at substantially the same height as the load lock chamber 70, the outer rotary shaft 33 is further lowered to the state as shown in FIG. 4A. In this state, the furnace port shutter 81 and the partition shutter 82 are advanced into the loading lock chamber 4, and swung and raised. And the upper furnace port shutter 81 closes the furnace port in the bottom of the processing vessel 11, so that little heat escapes from the interior of the processing vessel 11 into the loading chamber 4. At the same time, the lower partition shutter 82 partitions the interior of the loading chamber up and down between the liner plate 34 and the rotary holder 35, so that the treated wafer W at the high temperature, and the liner plate 34 and the reflectors 59 of the loading mechanism 31 at the same high temperature are separated from each other to be separately cooled efficiently by introduction of an inert gas from the upper and lower gas feed pipes 65, 66 and suction exhaust thereof through the gas exhaust pipes 67, 68. The thus-treated wafer W is conveyed outside through the load lock chamber 70.

The present invention is not limited to the above-described embodiment and covers various modifications unless they deviate from the gist of the present invention. For example, in the above-described embodiment, the vertical heat treatment apparatus is used as an oxidation apparatus or CVD apparatus for forming insulating films on semiconductor wafers W as objects to be treated. But kinds of objects to be treated and kinds of treatments are not especially limited and may be treatment apparatuses for conducting treatments on other kinds, such as LCD substrates, etc. Depending on the kind of treatment, in place of $N_2$ gas, inert gases may be fed in accordance with the kind of treatment.

As an example, the treatment gas, when the apparatus is used as a CVD apparatus to form polysilicon films, may be $SiH_4$, and when silicon nitride films are formed, $NH_4$, and $SiH_2Cl_2$ gas are used. The heating capacities of the respective heater unit 21–32 may be decided in accordance with treatments. For example, for the case of an oxidation apparatus, a treating temperature is set at 800°–1200° C., and for the case of a CVD apparatus, a treating temperature is set at 500°–1200° C.

In the vertical heat treatment apparatus of the above-described structure according to the embodiment, large objects to be treated, such as large-diameter semiconductor wafers, LCD substrates, etc. can be rapidly heated up to a set treating temperature while achieving uniform temperature distributions in plane and heat treatments of high precision can be conducted.

What is claimed is:

1. A vertical heat treatment apparatus comprising:
   a vertical processing vessel additionally including a heat source; and
   a loading mechanism for holding an object to be treated and loading the same into the processing vessel from below;
   the loading mechanism including a lift member to be loaded into and unloaded out of the processing vessel through the bottom thereof by a lift drive unit, a liner plate provided on the upper end of the lift member; and a rotary holder for holding the object to be treated horizontal above the liner plate while turning the object to be treated independently of the liner plate,
   whereby the object to be treated is heated to a treating temperature in the processing vessel so as to be heat treated, and wherein there is provided means for moving the rotary holder up and down between a heating position and a treating position independently of the liner plate.

2. The vertical heat treatment apparatus according to claim 1, wherein the loading mechanism includes gas injection means for injecting from below a film formation preventive gas to the underside of the object to be treated held on the rotary holder.

3. The vertical heat treatment apparatus according to claim 1, wherein a lid is mounted on an outer cylindrical shaft of the loading mechanism at a position near to the upper end of the loading mechanism and below the liner plate for closing a furnace port in the bottom of the processing vessel when the loading mechanism is lifted, and a plurality of reflector plates are provided above the lid at a set axial interval.

4. The vertical heat treatment apparatus according to claim 1, wherein a loading chamber is provided below the processing vessel, and a furnace port shutter and a partition shutter are provided parallel to each other at a vertical interval therebetween, such that when an atmosphere in the loading chamber is replaced with an atmosphere of an inert gas, the furnace port shutter and the partition shutter are swung into the loading chamber to close the furnace port and to partition the interior of the loading chamber up and down.

5. The vertical heat treatment apparatus according to claim 3, wherein an annular hollow water cooling disc is provided on the upper surface of the lid.

6. The vertical heat treatment apparatus according to claim 4, wherein the furnace port shutter and the partition shutter are in the form of hollow discs which permit water to be passed therethrough.

7. A vertical heat treatment apparatus comprising:
a vertical processing vessel additionally including a heat source; and
a loading mechanism for holding an object to be treated and loading the same into the processing vessel from below; the loading mechanism including a lift member to be loaded into and unloaded out of the processing vessel through the bottom thereof by a lift drive unit, a liner plate provided on the upper end of the lift member; and a rotary holder for holding the object to be treated in a horizontal orientation above the liner plate while turning the object to be treated independently of the liner plate, whereby the object to be treated is heated to a treating temperature in the processing vessel so as to be heat treated and wherein a loading chamber is provided below the processing vessel, and a furnace port shutter and a partition shutter are provided parallel to each other at a vertical interval therebetween, such that when an atmosphere in the loading chamber is replaced with an atmosphere of an inert gas, the furnace port shutter and the partition shutter are swung into the loading chamber to close the furnace port and to partition the interior of the loading chamber up and down, and wherein the furnace port shutter and the partition shutter are in the form of hollow discs which permit water to be passed therethrough.

8. A vertical heat treatment apparatus comprising:
a vertical processing vessel additionally including a heat source; and
a loading mechanism for holding an object to be treated and loading the same into the processing vessel from below; the loading mechanism including a lift member to be loaded into and unloaded out of the processing vessel through the bottom thereof by a lift drive unit, a liner plate provided on the upper end of the lift member; and a rotary holder for holding the object to be treated in a horizontal orientation above the liner plate while turning the object to be treated independently of the liner plate, whereby the object to be treated is heated to a treating temperature in the processing vessel so as to be heat treated and wherein there is provided a shaft attached to the rotary holder and a sub-lift drive unit which moves the shaft and rotary holder up and down between a heating position and a treating position independently of the liner plate.

* * * * *

UNITED STATES PATENT AND TRADEMARK OFFICE
CERTIFICATE OF CORRECTION

PATENT NO. : 5,443,648
DATED : August 22, 1995
INVENTOR(S) : Wataru Ohkase

It is certified that error appears in the above-identified patent and that said Letters Patent is hereby corrected as shown below:

In the left hand column of the cover sheet of the patent, please correct the second listed Assignee's name by changing it from "Tokyo Electron Toboku Kabushiki Kaisha" to --Tokyo Electron Tohoku Kabushiki Kaisha--

Signed and Sealed this

Second Day of January, 1996

*Attest:*

BRUCE LEHMAN

*Attesting Officer*        *Commissioner of Patents and Trademarks*